(12) United States Patent
Shojo et al.

(10) Patent No.: US 7,557,347 B2
(45) Date of Patent: Jul. 7, 2009

(54) CHARGED PARTICLE BEAM APPARATUS, SCANNING ELECTRON MICROSCOPE, AND SAMPLE OBSERVATION METHOD USING THE SAME

(75) Inventors: Tomoyasu Shojo, Kokubunji (JP); Muneyuki Fukuda, Kokubunji (JP); Naomasa Suzuki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 199 days.

(21) Appl. No.: 11/882,701

(22) Filed: Aug. 3, 2007

(65) Prior Publication Data

US 2008/0121803 A1 May 29, 2008

(30) Foreign Application Priority Data

Nov. 29, 2006 (JP) .............................. 2006-322204

(51) Int. Cl.
*G01N 23/00* (2006.01)
*G21K 7/00* (2006.01)

(52) U.S. Cl. ..................... 250/310; 250/306; 250/307; 250/311; 250/396 R; 250/397; 250/399

(58) Field of Classification Search ................ 250/306, 250/307, 310, 311, 396 R, 397, 396 ML, 250/399, 492.1, 492.2, 492.3
See application file for complete search history.

(56) References Cited

U.S. PATENT DOCUMENTS

| | | | | |
|---|---|---|---|---|
| 5,608,218 | A * | 3/1997 | Sato et al. | 250/310 |
| 6,476,388 | B1 * | 11/2002 | Nakagaki et al. | 850/9 |
| 6,501,077 | B1 * | 12/2002 | Sawahata et al. | 250/310 |
| 6,583,413 | B1 * | 6/2003 | Shinada et al. | 850/9 |
| 6,618,850 | B2 * | 9/2003 | Nishiyama et al. | 716/20 |
| 7,049,585 | B2 * | 5/2006 | Nakasuji et al. | 250/310 |
| 7,098,455 | B2 * | 8/2006 | Shinada et al. | 250/310 |
| 7,397,031 | B2 * | 7/2008 | Shinada et al. | 250/310 |
| 7,417,236 | B2 * | 8/2008 | Nakasuji et al. | 250/440.11 |
| 7,423,746 | B2 * | 9/2008 | Takeda et al. | 356/237.4 |
| 2008/0099673 | A1 * | 5/2008 | Fukuda et al. | 250/307 |
| 2008/0121803 | A1 * | 5/2008 | Shojo et al. | 250/307 |

FOREIGN PATENT DOCUMENTS

| | | |
|---|---|---|
| JP | 7-192679 | 12/1993 |
| JP | 9-171791 | 10/1996 |
| JP | 2001-357808 | 6/2000 |

* cited by examiner

*Primary Examiner*—Bernard E Souw
(74) *Attorney, Agent, or Firm*—Reed Smith LLP; Juan Carlos A. Marquez, Esq.

(57) ABSTRACT

A charged particle beam apparatus for acquiring high-definition and highly contrasted observation images by detecting efficiently secondary signals without increasing aberration of the primary electron beam, detecting defects from observation images and thus increasing the inspection speed and enhancing the sensitivity of inspection. The desired area of the sample is scanned with a primary charged particle beam, and the secondary charged particles generated secondarily from the area by the irradiation of the primary charged particle beam are led to collide with the secondary electron conversing electrode, and then the secondary electrons generated by the first E×B deflector 31 arranged through an insulator on the surface of the secondary electron conversing electrode on the side of the sample is absorbed by the detector. At the same time, the deflection chromatic aberration that had been generated in the primary charged particle beam by the first E×B deflector is reduced by the second E×B deflector arranged on the first E×B deflector, to obtain high-definition and highly contrasted observation images free of shading.

19 Claims, 8 Drawing Sheets

CHARGED PARTICLE BEAM APPARATUS, SCANNING ELECTRON MICROSCOPE, AND SAMPLE OBSERVATION METHOD USING THE SAME

CLAIM OF PRIORITY

The present application claims priority from Japanese application JP 2006-322204 filed on Nov. 29, 2006, the content of which is hereby incorporated by reference into this application.

FIELD OF THE INVENTION

The present invention relates to a method for manufacturing a wafer having a circuit pattern, and more particularly to a technique of inspecting a fine pattern using a charged particle beam.

BACKGROUND OF THE INVENTION

The scanning electron microscope is an apparatus for accelerating the primary electron discharged from the electron source, converging the same by an objective lens to narrow down the primary electron beam, scanning the sample with the primary electron beams by using a scanning deflector, detecting secondary signals generated from the sample by the irradiation of the primary electron beam and displaying this detected signal intensity as observation image. In order to obtain highly contrasted observation images, an efficient detection of secondary signals is required. In order to make a detector arranged outside the optical axis detect efficiently secondary signals, it is necessary to apply an electromagnetic field on the optical axis to deflect the secondary signals. However, this electromagnetic field increases the aberration of the primary electron beam. Therefore, in order to obtain a high-definition observation image enlarged at a high magnification, it is necessary to reduce the aberration of the primary electron beam. Therefore, it is necessary to contain the aberration of the primary electron beam generated on the optical axis between the electron source and the focus point on the sample.

JP-A No. 7(1995)-192679 discloses the technology of separating the orbit of the secondary electrons and the reflected electrons by using a deflector for deflecting the secondary electrons out of the axis of the primary electron beam and detecting selectively the secondary electrons and the reflected electrons.

JP-A No. 9(1997)-171791 shows an example of reducing the aberration amount of the primary electron beam generated in the secondary electron deflection field to detect efficiently the secondary electrons. JP-A No. 9(1997)-171791 discloses the technology of providing a secondary electron conversing electrode in which an opening for allowing the passage of the primary electron beam above the secondary electron detector, converting the secondary electrons generated or the reflected electrons from the sample that had collided with the secondary electron conversing electrode into secondary electrons, deflecting and detecting the same by the detector by using the secondary electron deflector to which the electromagnetic field is applied orthogonally to the secondary electron suction electric field, and canceling deflection by the electric field and deflection by the magnetic field by orthogonalizing the suction electric field and the magnetic field and correct the same. This technology is a method of detecting indirectly the secondary electrons (indirect detection method of secondary electron), and the deflection amount of the secondary electron can be small, and the impacts on the primary electron beam will be small in comparison with the direct detection method of deflecting the secondary electron substantially towards the detector.

However, in the configuration of the detector disclosed in JP-A No. 9(1997)-171791, the energy width of the primary electron beam generates deflection chromatic aberration in the secondary electron deflection field, and expands the diameter of the primary electron beam by several nanometers. For a scanning electron microscope in which a nm-order resolving power is required, the deflection chromatic aberration described above is not negligible.

On the other hand, a technology for reducing the deflection chromatic aberration by the secondary beam deflector is disclosed in JP-A No. 2001-357808. JP-A No. 2001-357808 discloses the technology of canceling the deflection aberration of the primary electron beam generated in the deflector by installing a secondary electron deflector that applies magnetic field orthogonally to the secondary electron deflection magnetic field in order to deflect the secondary electrons, and by installing another deflector to be operated under the condition that the polarity of deflection direction will be directly opposite to the electron source side from the deflector mentioned above.

SUMMARY OF THE INVENTION

A semiconductor circuit pattern inspection includes a step of detecting defects at a low magnification and another step of obtaining inspection images for observing detailed defects at a high magnification and inspecting patterns. The normally used magnification is approximately 5,000-40,000 times for the detection of defects described above, the magnification of the image for inspection mentioned above is approximately 50,000-200,000 times and the resolution performance required for the images to be inspected is in the nm order.

Secondary electron images obtained mainly by detecting the secondary electrons generated in the surface layer of sample are contrasted by the difference in materials and edge effect. As a result, it is possible to detect defective parts by comparing the secondary electron images of two observation points having the same structure.

However, the surface of a semiconductor wafer is often covered with an insulator to form a circuit, dapples of brightness in the image (shadings) not attributable to defects often develop on the secondary electron image due to an electrostatic charge of the sample, after the irradiation of primary electron beam. Such shadings are highly likely to cause wrong detections in the process of detecting defects in the secondary electron images.

Therefore, in order to correctly detect and observe defects in the secondary electron images, it is necessary to obtain high-definition and highly contrasted observation images without shading.

JP-A No. 9(1997)-171791 does not pay attention to the fact that, due to changes in the angle of the deflection electric field to the secondary electron conversing electrode on the equipotential surface depending on the in-plane position on the secondary electron conversing electrode where secondary electrons collide, the efficiency of detecting the secondary electrons discharged from the secondary electron conversing electrode (called "tertiary electron") is varied. There is no problem if secondary electrons collide in a narrow area on the secondary electron conversing electrode. However, when the secondary electrons are greatly deflected due to a low magnification for observation or uneven distribution of electrostatic charge of sample, secondary electrons collide in the area where detection efficiency of the secondary electron conversing electrode change resulting in the shading described above. These points are not taken into consideration.

In electron beam application apparatus, the primary electrons extracted from the electron source have an energy width determined by the electron source. When primary electrons pass through the secondary electron deflector shown in JP-A No. 9(1997)-171791, they go straight ahead because the latter is designed in such way that the deflection action due to the electric field and the deflection action due to the magnetic field applied vertically to the electric field for the primary electron beam having an energy V would cancel each other. However, if the primary electrons have an energy width of $\Delta V$, the deflector mentioned above gives an angle of deflection $\theta$ to the primary electron beam having an energy of $V+\Delta V$ with the optical axis. And it gives a deflection distance r at a place separated by a distance L from the deflector. Such deflection amounts enlarge the diameter of the primary electron beam on the sample, and causes resolving power to deteriorate, and as a result it will be difficult to achieve the required resolving power at a high magnification.

The technology of reducing the impact of aberration by this deflector on primary electron beam is disclosed in JP-A No. 2001-367808 as described above. However, it is limited to the disclosure of constitution according to the direct detection method of secondary electrons, and its application to the indirect detection method of secondary electrons is not disclosed.

And according to JP-A No. 2001-357808, the first deflector for deflecting the secondary electrons towards the detector and the second deflector for canceling deflection chromatic aberration are located at separate positions. As a result, the second deflector corrects the deflection angle $\theta$ that the first deflector gives to the primary electrons, and cannot correct the deflection distance r.

The object of the present invention is to provide a charged particle beam apparatus, a scanning microscope, and sample observation method wherein the deflection aberration of the primary electron can be corrected in the indirect detection method of the secondary electrons.

In order to achieve the above-mentioned object, the present invention provides a charged particle beam apparatus for irradiating a sample with primary charged particle beam and detecting secondary charged particles secondarily generated including a stage to hold the sample, a charged particle source for generating the primary charged particle beam, a condenser lens for converging the primary charged particle beam, an objective lens for irradiating the sample with the converged primary charged particle beam, a secondary electron conversion unit arranged between the condenser lens and the objective lens, and the secondary electron conversion unit includes a secondary electron conversing electrode to which the secondary charged particles generated from the samples are collided, a first ExB deflector for deflecting the secondary electrons generated on the secondary electron conversing electrode, a secondary ExB deflector for reducing the deflection chromatic aberration generated on the primary charged particle beam by the first ExB deflector, and a detector for detecting the secondary electrons generated by the secondary electron conversing electrode.

And in the sample observation method according to the present invention, a desired area of the sample is scanned with the primary charged particle beam, the secondary charged particle generated secondarily from the desired area as a result of the irradiation of the primary charged particle beam is made to collide with the secondary electron conversing electrode, and then the secondary electrons generated by the collision with the first ExB deflector arranged on the surface of the secondary electron conversing electrode on the sample side through an insulator are injected into the detector. At the same time, the deflection chromatic aberration that develops in the primary charged particle beam in the first ExB deflector by the second ExB deflector arranged on surface of the secondary electron conversing electrode on the electron source side through an insulator is reduced. And according to this sample observation method, it is possible to reduce deflection color aberration by disposing the first ExB deflector and the second ExB deflector with a 180 degree rotation to the primary electron particle beam. Furthermore, according to this sample observation method, it is possible to reduce the in-plane variation of detection efficiency by applying the voltage of the ground electrode of the first ExB deflector to the secondary electron conversing electrode as the reference potential.

According to the present invention, it will be possible to detect efficiently secondary signals without increasing aberration of the primary electron beam, and to increase the inspection speed and sensitivity by detecting defects by means of high-resolution and highly contrasted observation images.

DETAILED DESCRIPTION OF THE PREFERRED EMBODIMENTS

We will describe below the embodiments of the present invention with reference to drawings.

First Embodiment

Figure 1:
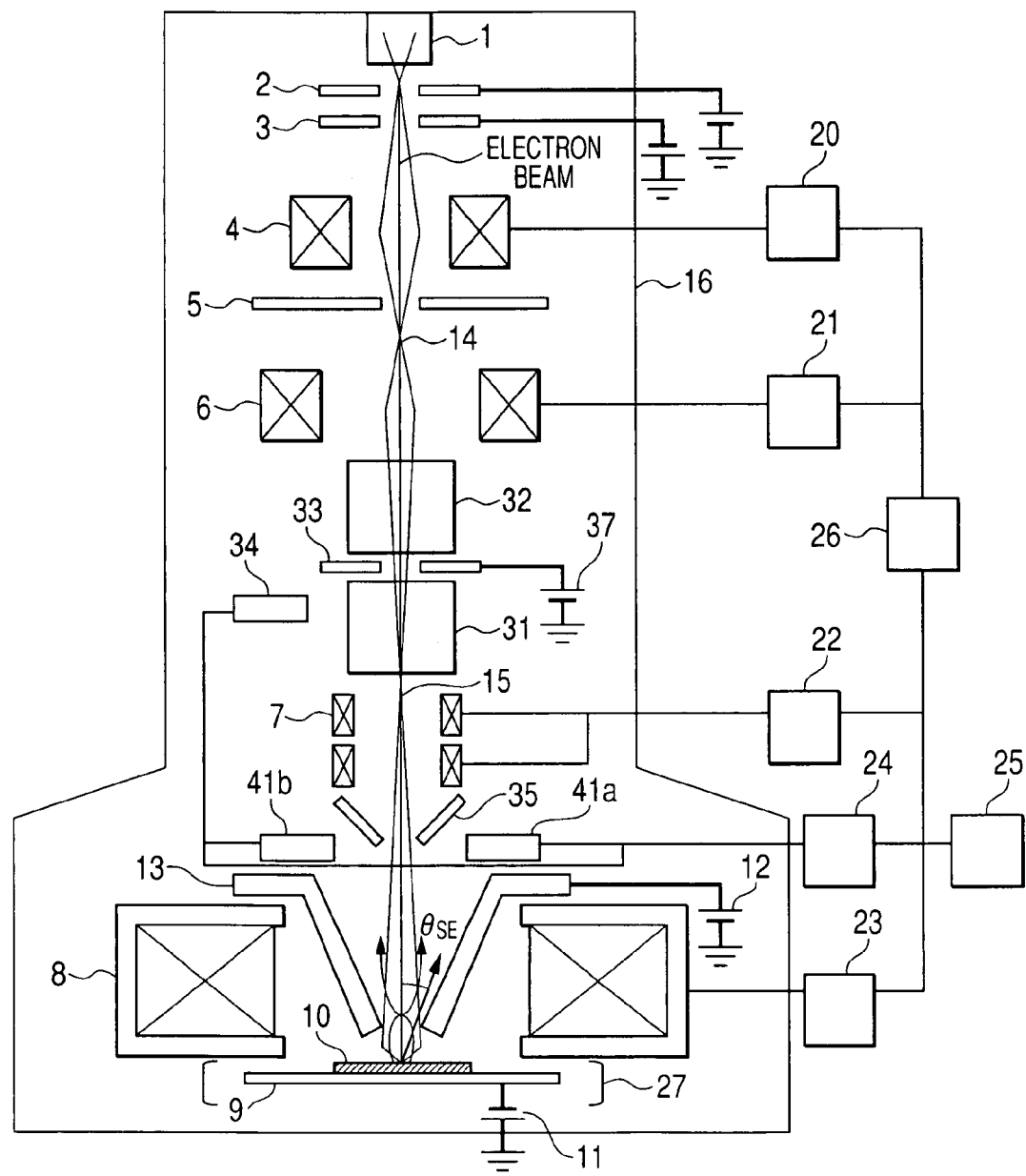
FIG. 1 illustrates a review SEM that is a first embodiment of the present invention.

FIG. 1 shows a review SEM (scanning electron microscope) constituting the first embodiment. The review SEM of this embodiment is an apparatus designed to obtain the image of defects or foreign matters in a semiconductor wafer, to detect fatal defects and classify the detected defects.

The review SEM is an electron beam applied apparatus carried out by a scanning electron microscope having a semi-in-lens objective lens, and includes roughly speaking an electron optical system, a sample chamber 27, a control unit 26 and an electronic detection system.

The electronic optical system includes an electronic gun 1, an extraction electrode 2, an acceleration electrode 3, a first condenser lens 4, a second condenser lens 6, an aperture diaphragm 5, a scanning deflector 7, an objective lens 8, and a magnetic electrode 13 above the objective lens. The sample chamber 27 includes a stage 9. The magnetic electrode 13 above the objective lens includes a booster voltage power source of variable voltage 12, and the stage 9 includes a retarding voltage power source 11 with variable voltage.

The electronic detection system includes E×B deflectors 31 and 32, secondary electron conversing electrodes 33 and 35, a secondary electronic detector 34, stereoimage detectors 41a and 41b. The secondary electron conversing electrode 33 is connected with a voltage power source 37. The detected signals are sent to the detected signals processor 24, where the former are computed and processed for the judgment of defects. The images taken in are displayed on the monitor 25. The operational commands and operational conditions of various parts of the apparatus are inputted and outputted by the control unit 26.

Figure 2:
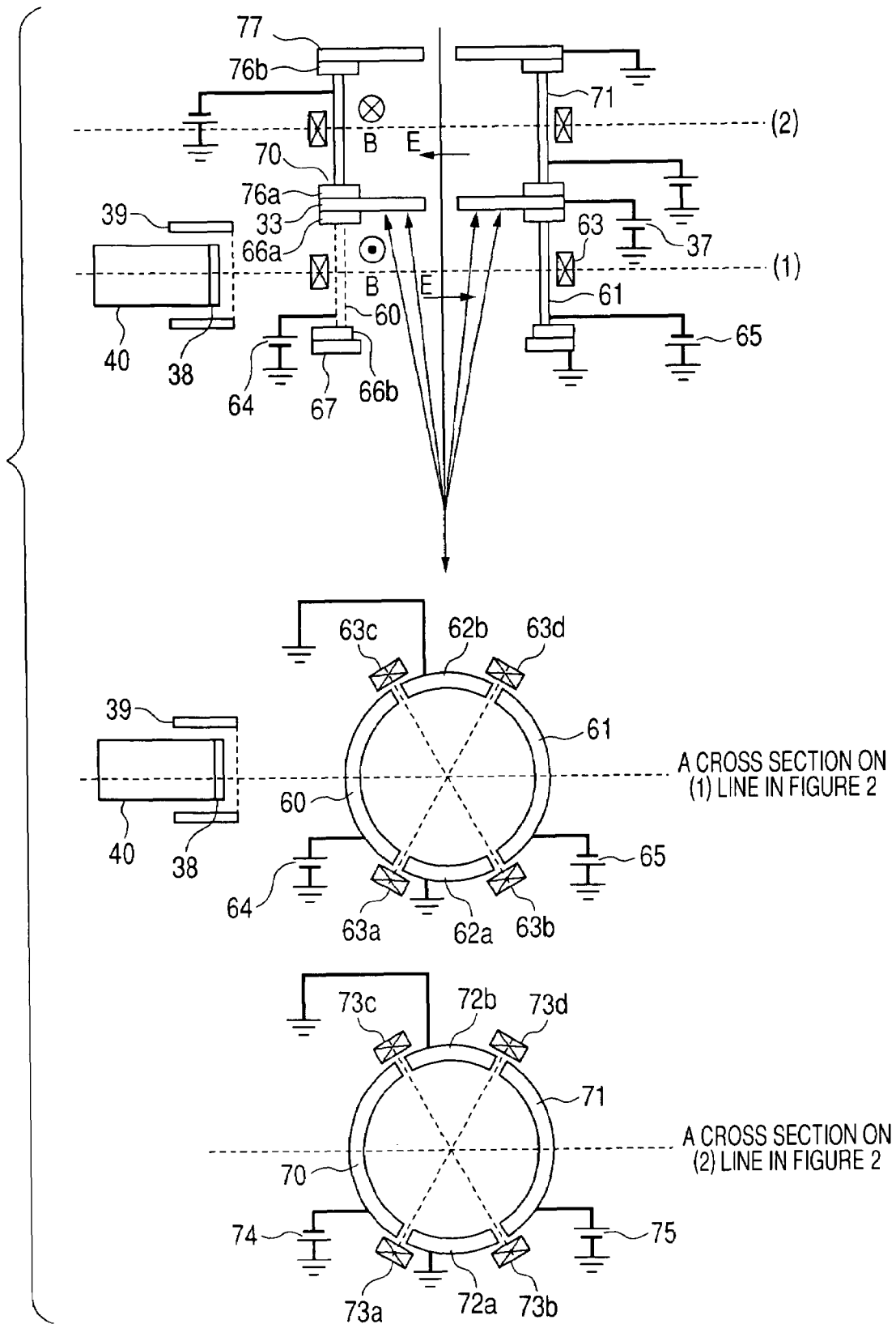
FIG. 2 illustrates an embodiment of the secondary electron deflector according to the first embodiment.

As shown in FIG. 2, the E×B deflector 31 includes four electrodes for making the deflection magnetic field 60, 61, 62a and 62b, four coils for making a deflection magnetic field 63a, 63b, 63c, and 63d, a ground electrode 67, and insulators 66a and 66b. The electrode 60 is connected with the voltage power source 64 so that the positive voltage may be applied, and the electrode 61 is connected with the voltage power source 65 so that the negative voltage may be applied. The electrode 61 may be grounded in some cases. The electrodes 62a and 62b are grounded. The E×B deflector 32 includes four electrodes for making the deflection magnetic field 70, 71, 72a and 72b, four coils for making the deflected magnetic field 73a, 73b, 73c, and 73d, a ground electrode 77, and insulators 76a and 76b. The electrode 70 is connected with the voltage power source 74 so that the positive voltage may be applied, and the electrode 71 is connected with the voltage power source 75 so that the negative voltage may be applied. The electrode 71 may be grounded in some cases. The electrodes 72a and 72b are grounded. The secondary electron conversing electrode 33 is connected with the voltage power source 37. It is connected with the E×B deflector 31 through the insulator 66a and with the E×B deflector 32 through the insulator 76a. The two E×B deflectors 31 and 32 are connected on the same axis with the opening through which the primary electron beam passes serving as the central axis. The secondary electron detector 34 includes a fluorescent body 38, a secondary electron suction high-voltage electrode 39 and a detector 40.

In this embodiment, E×B deflectors 31 and 32, a secondary electron conversing electrode 33, and a secondary electron detector 34 located between the condenser lens and the scanning deflector 7 constitute the secondary electron conversion unit. This secondary electron conversion unit has a function of reducing the deflection chromatic aberration. This secondary electron conversion unit should preferably be disposed near the crossover point of the primary electron beam passing through the condenser lens.

As the electron source for the electron gun 1, for example a diffusion supply-type thermal field emission electron source is used. And the electron gun 1 has an extraction electrode 2, and the primary electron beam is extracted from the electron gun 1 by applying voltage on the extraction electrode 2. A negative voltage −V0 is applied on the acceleration electrode 3, and the primary electron beam passes through the acceleration electrode 3 with an energy of V0. Then, it is converged by the condenser lens 4 and constitutes a crossover 14. The condenser lens 4 is connected with the condenser lens power source 20, and the control unit 26 controls its operation. And at the time of passing through the aperture 5, its current is limited. And the primary electron beam is converged by the condenser lens 6 to make the crossover 15. The condenser lens 6 is connected with the condenser lens power source 21, and the control unit 26 controls its operation. The condenser lens 4 and the condenser lens 6 are controlled in such a way that the crossover 15 may be located between the E×B deflector 31 and the scanning deflector 7. The primary electron beam is narrowed down sharply by the objective lens having an objective lens power source 23 controlled by the control unit 26.

The stage 9 includes a voltage-variable retarding voltage power source 11 so that the high-voltage potential-Vr for decelerating the primary electron beam (retarding potential) may be variable. Due to the retarding potential, the primary electron beam, being drastically decelerated directly above the substrate to be inspected 10 mounted on the stage 9, is converged on the substrate to be inspected by the objective lens 8. And the scanning deflectors 7 disposed in two stages between the condenser lens 6 and the objective lens scan the substrate to be inspected 10. The scanning deflectors 7 are connected with the scanning signal generator 22, and the control unit 26 controls their operation.

The energy of the primary electron beam at the time of irradiation on the sample is (V0−Vr). Since the values of V0=2 kV and Vr=1.2 kV are set in this embodiment, the sample is irradiated with a primary electron beam of 800 eV. At this time, we take the running direction of the primary electron as the z axis. The irradiation of the primary electron beam generates secondary electrons having an energy of approximately 0-50 eV, and reflected electrons having an energy higher than 50 eV from the substrate to be inspected 10. The energy of the generated secondary electrons is expressed as $E_{SE}$.

The angle $\theta_{S.E.}$ between the sample surface and the normal line shall be the emission angle of the secondary electrons and the reflected electrons. Since the retarding voltage Vr is applied on the stage, the energy of the secondary electrons will be $(E_{S.E.}+Vr)$. The electrode 13 above the objective lens includes a variable-voltage booster voltage power source 12 so that a positive potential (booster potential) for increasing secondary electrons may be applied thereon. In this embodiment, we have chosen a booster potential of 2 kV. This potential pulls up the secondary electrons to the electron source side by the booster potential, causes the secondary electrons to advance being wound up towards the electron source side by the magnetic field created by the objective lens, and to pass through the hole in the secondary electron conversing electrode 35 to collide with the secondary electron conversing electrode 33.

The reflected electrons generated by the substrate to be inspected are divided into four categories by the angle of emission. (1) The component having a very low emission angle $\theta_{S.E.}$ passes through the hole of the secondary electron conversing electrode 35 and collides with the secondary electron conversing electrode 33. (4) The component having a high emission angle $\theta_{S.E.}$ collides with the objective lens 8 and fails to reach the detector. And the component (2) close to (1) collides with the secondary electron conversing electrode 35 between (1) and (2), and the component (3) close to (4) directly penetrates into the detectors 41a and 41b. The collision of the reflected electrons with the secondary electron conversing electrode 35 results in the generation of secondary electrons from the secondary electron conversing electrode 35. The detectors 41a and 41b detect the signals of secondary electrons. The reflected electrons generated at large angles fail to collide with the secondary electron conversing electrode 35 and are directly detected by the detectors 41a and 41b. The detectors 41a and 41b are located at corresponding positions (right and left). This structure is intended to separate the reflected electron into the right and left ones and to enable to observe more three-dimensionally the defects, foreign matters and other items for observation on the substrate to be inspected.

The secondary electron conversing electrode 33 is a discoidal electrode having a central hole for allowing the passage of primary electron beam and includes a means for applying voltage. Phosphor bronze is used as its material because of ease of acquisition and processing, but other materials may be used. Its surface is coated with gold mainly in order to prevent the adhesion of polluting matters by the irradiation with secondary electron beams. In addition to gold, silver, platinum and the like may be used. And materials having a high efficiency of generating secondary electrons by the irradiation of electron beams such as MgO may sometime be coated on the gold coating layer.

The wound up secondary electrons are deflected by the scanning deflector 7 and collide with the secondary electron conversing electrode 33. Secondary electrodes are generated on the secondary electron conversing electrode 33, and the secondary electrons are deflected by the secondary electron deflector 31 in the direction of the secondary electron detector 34.

As mentioned above, FIG. 2 shows an embodiment of the deflectors 31 and 32. In FIG. 2, the E×B deflector 31 for deflecting the secondary electron is situated on the side of the stage from the secondary electron conversing electrode 33 and is connected with the secondary electron conversing electrode 33 through an insulator 76a. The E×B deflector 22 for canceling the deflection aberration created by the deflector 31 in relation to the primary electron beam is situated on the side of the electron source from the secondary electron conversing electrode 33, and joins with the secondary electron conversing electrode 33 through an insulator 76a.

Although the E×B deflector 31 and the E×B deflector 32 have the same electrode and coil disposed in the same way, they are disposed in two-rotation symmetrical positions so that their deflection electric field and their deflection magnetic field may be inversed.

A cross-sectional view cut out along the line (1) in FIG. 2 is the central section of FIG. 2, and illustrates the detector 34 and the E×B detector 31. The E×B deflector 31 is a deflector that puts the deflection electric field (E) and the deflection magnetic field (B) into action orthogonally. It creates a deflected electric field (E) by creating a difference in electric potential between two symmetrical electrodes, i.e. the electrode 60 and the electrode 61 so that the secondary electrons may be deflected towards the detector 34. In this embodiment, the electrode 60 is charged with the positive potential and the electrode 61 is charged with the negative potential. The deflection direction of the secondary electron is expressed by x axis. When an axis perpendicular to the x axis and the z axis is expressed as the y axis, the disposition of symmetrical grounding electrodes 62a and 62b on both sides of the y axis can create a uniform deflection electric field in the deflector 31. The electrodes 60, 61, 62a and 62b are sections of a discoidal electrode obtained by splitting the same. And the degree of splitting is 120 degrees for the electrode 60 and the electrode 61, and 60 degrees for the electrode 62a and the electrode 62b. And the electrode 60 is a mesh electrode allowing the secondary electrons to penetrate inside and to reach the detector 34.

The detector 34 includes a second electron extraction high-voltage electrode 39 for accelerating secondary electrons, a fluorescent body 38 and a detector 40. The electrode 39 accelerates the secondary electrons that have penetrated the mesh electrode and the secondary electrons emitted from the mesh electrode with which the secondary electrons had collided. In this embodiment, we applied a 10 kV voltage to the electrode 39, accelerated the secondary electrons to penetrate into the fluorescent body 38 and detected the secondary electrons that emitted from the same with the detector 40. For the detector 40, we used an electronic light amplifier. For the detector 40, a semiconductor detector, a multi-channel plate detector or the like may be used. The electrode 61, the electrode 62a, and the electrode 62b need not be mesh electrodes but may be plate electrodes. The deflection magnetic field (B) is made of two pairs of electrode 60, electrode 61 and electrode 62a and electrode 62b arranged outside the part where they are adjacent, a total of four coils 63a, 63b, 63c, and 63d.

The cross-sectional view obtained by cutting off FIG. 2 upper section by the line (2) is FIG. 2 lower section and illustrates the E×B detector 32. The electrode 70 is charged with a negative potential, while the electrode 71 is charged with a positive potential. Therefore, its deflection polarity is reverse of that of the deflector 31. Its deflection magnetic field is put into action in such a way that it may be reverse to that of the deflector 31.

The E×B deflectors 31 and 32 are operated under a condition that they have no deflective action on the primary electron beam (Wien condition) when the deflection direction of the electric field and the deflection direction of the magnetic field vis-à-vis the primary electron beam cancel each other. Let us consider the following model of deflector. When the length of a deflection electrode is expressed by $2 \times l_L$, the distance between deflection electrodes is expressed by $d_L$, when $+V_L/2$ is applied to the deflection electrode in the deflection direction of the secondary electron, and $-V_L/2$ is applied to the opposite deflection electrode, and when the intensity of the deflection magnetic field is expressed by $B_L$, the deflection amount $\Delta x_L$ at a place separated by $L_L$ from the center of the center of the deflector to the sample side is expressed by the equation (1).

[Equation 1]

$$\Delta x_L = \text{(deflection amount in the deflection electric field } \Delta x_{EL}) - \text{(deflection amount in the deflection magnetic field } \Delta x_{BL}) = \frac{l_L \times L_L}{d_L} \times \frac{V_L}{V_0} - \sqrt{\frac{2e}{m}} \times \frac{B_L \times l_L \times L_L}{\sqrt{V_0}}$$

Equation (1)

In the above equation, the acceleration voltage is expressed by $V_0$, the mass of electron is expressed by m, and the quantity of electric charge of electrons is expressed by e.

It is possible to satisfy the Wien condition by setting the parameters in such a way that $\Delta x_L$ may be nil. Since the force that the deflection electric field exerts to the secondary electrons and the force that the deflection magnetic field exerts to the same are in the same direction, in the equation (1) the symbol of $\Delta x_L$ will be positive, and the deflection action works towards the detector side.

And although in this embodiment we showed two pairs and total four deflection magnetic coils, it is possible to an orthogonal magnetic field with a pair and two coils. However, with two pairs and total of four coils, it is possible to create a magnetic field of a higher orthogonal degree to the deflection electric field.

Figure 3:
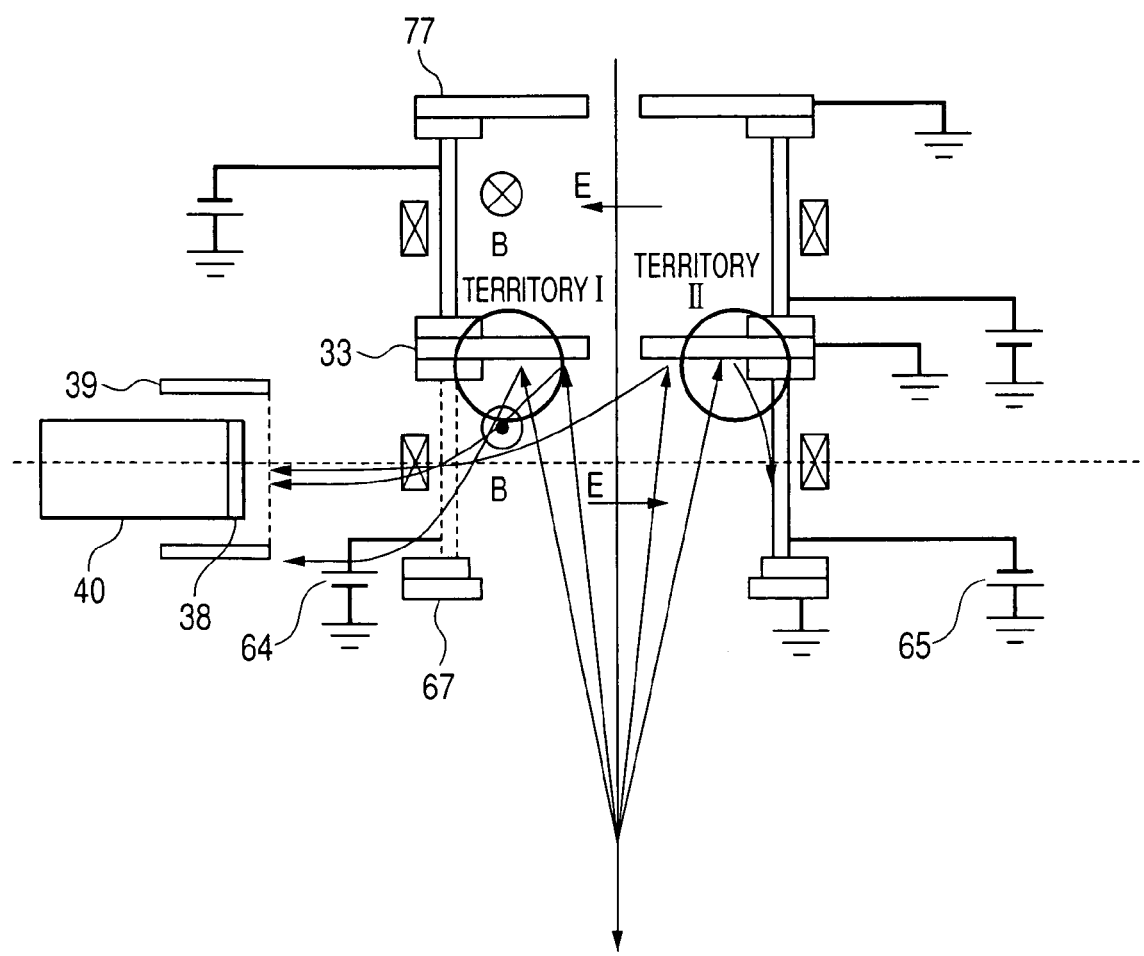
FIG. 3 describes examples of orbit of the secondary electrons in the configuration of the first embodiment.

FIG. 3 shows an example of orbit of the secondary electrons when the secondary electron conversing electrode 33 is grounded for comparison. Since the potential beam is parallel with the secondary electron conversing electrode 33 in an area close to the detector (referred to as "Area I"), the secondary electrons emitted from the Area 1 are strongly affected by the force directed towards the sample from the deflection electric field. As a result, the secondary electrons do not enter the detector and hit the lower part of the cover of the detector, resulting in a lower efficiency of detecting the secondary electrons in the Area 1. In an area far apart from the detector (referred to as "Area II"), as the secondary electrons emitted in the opposite direction from the detector collide with the electrode 62, the efficiency of detecting the secondary electrons decreases in the Area II. Therefore, there are differences in the efficiency of detecting the secondary electrons in the surface of the secondary electrons conversion electrode, and it becomes uneven. When the sample is observed at a low magnification, the secondary electrons are intensely deflected by the scanning deflector, and scan the secondary electron conversing electrode 33. When the scope of scanning includes the Area I and II where the efficiency of detection has declined, there are differences in the efficiency of detecting the secondary electrons depending on the place of scanning, and this can be the cause of development of shading (spots of brightness) on the acquired image. If any shading appears, due to the use of difference information of contrast between the normal part and the defective part in the judgment of defects, normal inspections cannot be performed.

Accordingly, in this embodiment, as shown in FIGS. 1 and 2, the voltage control means 37 is used to apply voltage on the secondary electron conversing electrode 33, to control the potential at a level higher than the electrodes 62a and 62b and to adjust thus the equipotential distribution, and thus to create the force for pulling up the secondary electrons towards the conversion electrode. In this way, the secondary electrons that collide with the lower part of the cover for the detector and the electrode 61 and are not absorbed by the detector advance between the secondary electron conversing electrode 33 and the grounded electrode 67.

Figure 4:
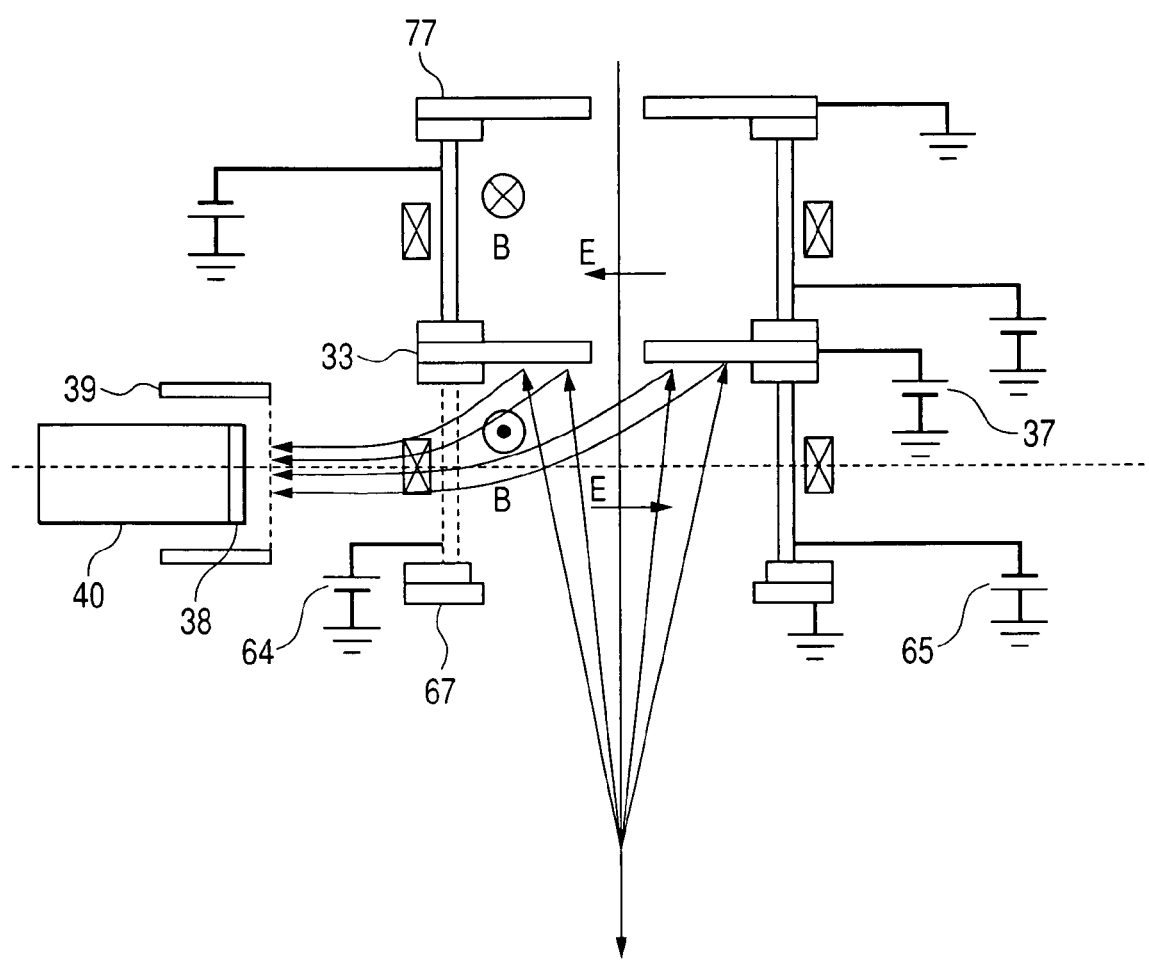
FIG. 4 describes examples of orbit of the secondary electrons in the configuration of the first embodiment.

FIG. 4 shows an example of orbit of the secondary electrons when a voltage is applied to the secondary electron conversing electrode 33. As FIG. 4 shows clearly, the deflected secondary electrons penetrate the mesh deflection electrode 60, are accelerated by the electric field created by the extraction electrode 39, hit the fluorescent body 38, and excite the fluorescent body to generate light. The detector 40 detects this light.

The E×B deflector 31 orthogonalizes the deflection electric field and the deflection magnetic field so that there may be no deflection action on the primary electrons. It generates, however, a deflection chromatic aberration in the primary electron beam having an energy width of $(\Delta V_0)$. The quantity of deflection $\Delta x_{LC}$ of the primary electrons having an energy of $V0+\Delta V_0$ at a place separated by $L_L$ from the center of the deflector is expressed by the equation (2).

[Equation 2]

$$\Delta x_{LC} = \left( \frac{1_L \times L_L}{d_L} \times \frac{V_L}{V_0 + \Delta V_0} - \sqrt{\frac{2e}{m}} \times \frac{B_L \times 1_L \times L_L}{\sqrt{V_0 + \Delta V_0}} \right) \quad \text{Equation (2)}$$

Another deflector whose polarity is inverted is arranged for correcting the deflection aberration. In other words, the length of the deflection electrode of the E×B deflector 32 for correcting deflection aberration is set at $2 \times L_u$, the distance between deflection electrodes is set at $d_u$, $-V_u/2$ is applied on the deflection electrode in the deflection direction of the secondary electrons, and $+V_u/2$ is applied on the symmetric deflection electrode, and the intensity of the deflection magnetic field is set at $B_u$. The quantity of deflection of $\Delta x_{UC}$ of the primary electrons mentioned above at a location separated by Lu from the center of the deflector to the sample side is expressed by the equation (3).

[Equation 3]

$$\Delta x_{UC} = -\left( \frac{1_U \times L_U}{d_U} \times \frac{V_U}{V_0 + \Delta V_0} - \sqrt{\frac{2e}{m}} \times \frac{B_U \times 1_U \times L_U}{\sqrt{V_0 + \Delta V_0}} \right) \quad \text{Equation (3)}$$

The total sum of the quantity of deflection of the upper and lower deflectors is the total sum of the equation (2) and the equation (3).

[Equation 4]

$$\Delta x = \left( \frac{1_L \times L_L}{d_L} \times \frac{V_L}{V_0 + \Delta V_0} - \sqrt{\frac{2e}{m}} \times \frac{B_L \times 1_L \times L_L}{\sqrt{V_0 + \Delta V_0}} \right) - \left( \frac{1_U \times L_U}{d_U} \times \frac{V_U}{V_0 + \Delta V_0} - \sqrt{\frac{2e}{m}} \times \frac{B_U \times 1_U \times L_U}{\sqrt{V_0 + \Delta V_0}} \right) \quad \text{Equation (4)}$$

It is possible to reduce deflection chromatic aberration by setting the length of the deflection electrode and the voltage to be applied in such a way that the value of equation (4) may be zero.

Incidentally, the energy width of the primary electron beam is determined by the electron source 1, and the energy width of the electron source Zr/O/W used in this embodiment is evaluated at 0.6 eV. This primary electron beam passing through the condenser lens 6 creates a crossover point between the deflectors 31, 32 and the scanning deflector 7. The primary electron beam having an energy of $(V0+\Delta V0)$ has the total sum $\Delta x$ of the deflection quantity of the upper and lower deflectors and the total sum $\Delta \theta$ of deflection angle of the upper and lower deflectors at the crossover point.

In this embodiment, the secondary electron conversing electrode 33 and two deflectors are connected each other through an insulator. The two deflectors are arranged at close positions, and as the distance between the crossover point and the respective deflector is approximately the same, it is possible to correct both $\Delta \theta$ and $\Delta x$, and the primary electron beam penetrates vertically the center of the objective lens and pass through the same.

Generally, when the primary electron beam enters a electromagnetic lens with an angle, an aberration develops out of axis. However, in order to reduce aberration with an objective lens for which an electromagnetic lens is used, it is necessary to inject the primary electron beam vertically into the objective lens 8. As stated above, the configuration of this embodiment that enables to inject the primary electron beam vertically along the center of the objective lens 8 enables to cancel deflection chromatic aberration with a good precision even if an electromagnetic lens is used for the objective lens 8 shown in FIG. 1.

Second Embodiment

Figure 5:
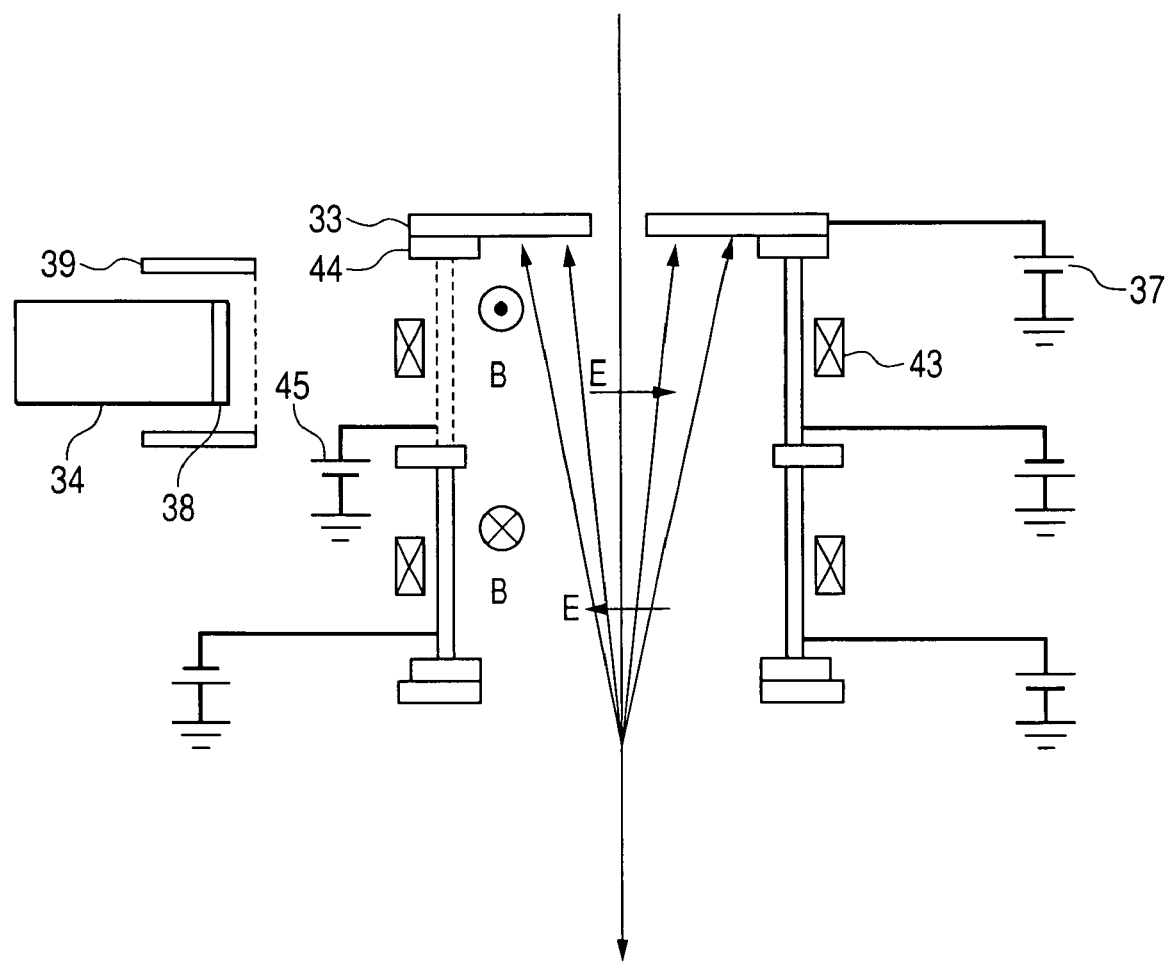
FIG. 5 illustrates the configuration of important parts of a second embodiment of the present invention.

FIG. 5 shows a second embodiment. The configuration of this embodiment is a configuration in which the position of the deflector 31 and that of the deflector 32 in the first embodiment are switched. FIG. 5 shows the same configuration as that of the first embodiment except the position of the deflector 31 and the deflector 32. The configuration of the second embodiment is characterized in that the deflector 31 for deflecting the secondary electrons is located closer to the side of the electron source than the deflector 32 for correcting aberration and is connected with the secondary electron conversing electrode 33 through an insulator. The deflector 31 and the deflector 32 are connected through an insulator, and are operated in such a way that their polarity of deflection may be reverse. In the first place, the secondary electrons are deflected by the deflection field created by the deflector 32 for correcting aberration. After passing through the deflection field mentioned above, they are deflected by the deflection field created by the deflector 31 for deflecting the secondary electrons. The direction of deflection by these two deflectors is directly opposite because the polarity of deflection of the two deflectors is reversed, and the quantity of deflection cancels each other. Since the action of deflection for the secondary electrons remains unchanged and the action of correcting aberration for the primary electron beam also remains unchanged, the effect will be, like the first embodiment, that the efficiency of detecting the secondary electrons will be high and uniform in the surface of the secondary electron conversing electrode. And the effect of correcting deflection aberration for the primary electrons can be obtained in the same way as in the first embodiment.

Third Embodiment

Figure 6:
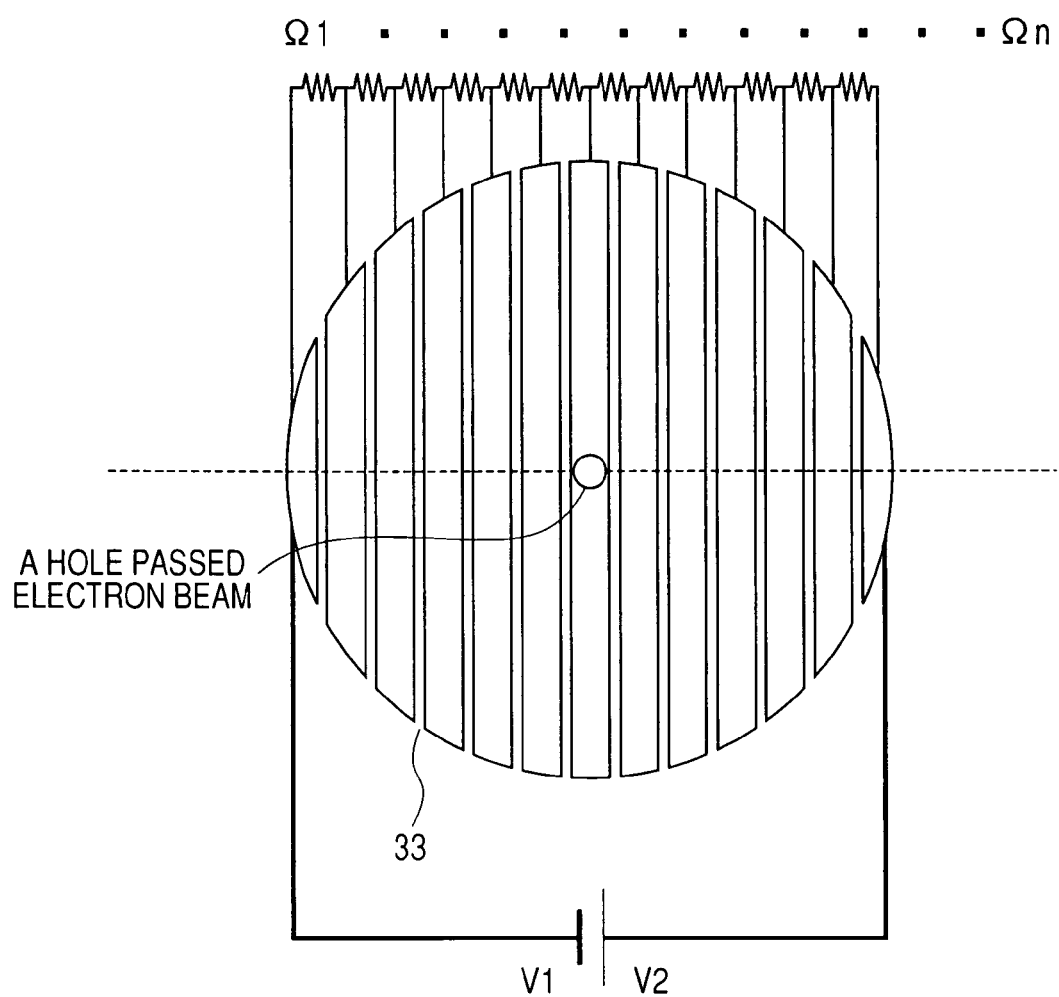
FIG. 6 illustrates the structure of the secondary electron conversing electrode of a third embodiment of the present invention.

Then, we will describe a third embodiment. While, in the first embodiment, the whole secondary electron conversing electrode was set in a same potential, in this embodiment, a secondary electron conversing electrode 33' having a structure capable of changing continuously potential is used as the secondary electron conversing electrode. We will describe the secondary electron conversing electrode 33' of this embodiment with reference to FIG. 6. It is the same as the first embodiment except the structure of the secondary electron conversing electrode. In the first place, a thin metal foil having an equivalent dimension and shape as the surface area of the secondary electron conversing electrode is divided and cut out into n pieces. The direction of cutting is in the parallel direction with the y axis. And the greater the value of n is, the better. The cut out metal foils will be pasted on the surface of the secondary electron conversing electrode in such a way that they may not contact each other, and the adjacent metal foils are connected with resistances. Therefore, n pieces of metal foils are connected in series by using n−1 pieces of resistances (Ω). All the n−1 pieces of resistances to use shall be those having the same resistance value. Incidentally, the secondary electron conversing electrode 33' shall have an opening for allowing the passage of primary electron beam at its center.

When a potential V1 is applied to the electrode 60 of the deflector 31 and a potential V2 is applied to the electrode 61, a power source shall be arranged in such a way that the deflection electric field electrode 60 side of the metal foil pasted on the surface of the secondary electron conversing electrode 33 may be V1 and the deflection electric field electrode 61 side may be V2. Since the metal foils are connected in series, potentials of (V1−V2)/n will be distributed.

According to the above-mentioned configuration of this embodiment, the equipotential beam of the deflection electric field is vertical to the secondary electron conversing electrode, as shown in the first embodiment the secondary electrons will be absorbed into the detector without any loss.

Fourth Embodiment

Figure 7:
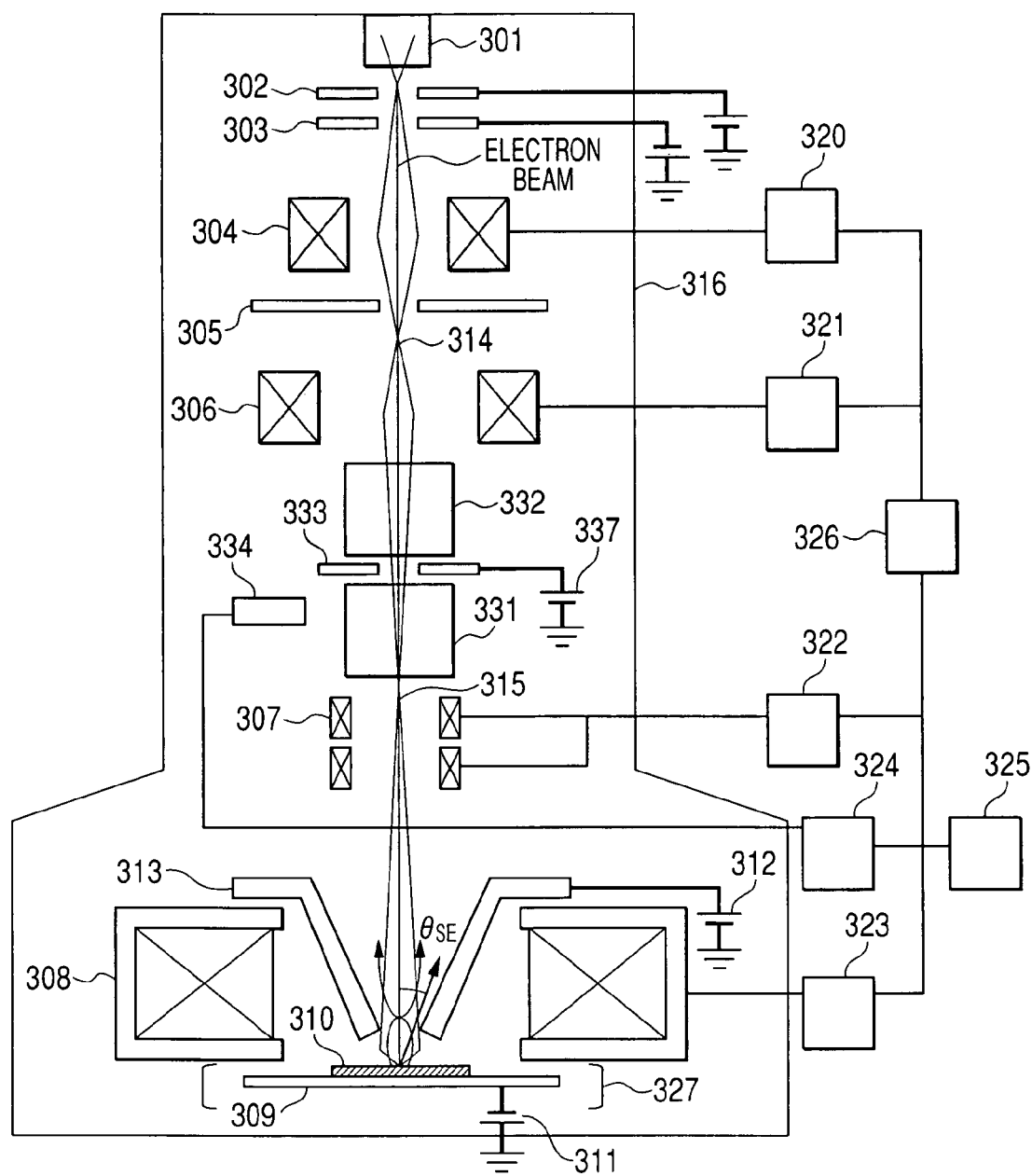
FIG. 7 is an illustration showing an example of carrying out in a semiconductor dimension measurement scanning electron microscope as a fourth embodiment of the present invention.

Then, as the fourth embodiment of the present invention, we will show in FIG. 7 an example of carrying out the present invention in a semiconductor dimension measurement scanning electron microscope (dimension measurement SEM) for measuring the dimension of semiconductor patterns. If there is any shading on the acquired image (or two-dimensional distribution information of pixels) for measuring the dimension and inspecting semiconductor patterns, it is impossible to precisely measure the dimension and evaluate semiconductor patterns. Therefore, the configuration of this embodiment is effective. This embodiment shows an example of carrying out the present invention in a scanning electron microscope having a semi-in-lens objective lens.

The dimension measurement SEM can be broadly divided into the electron optical system, the sample chamber 327, the control unit 326, and the electron detection system. The electron optical system includes an electron gun 301, an extraction electrode 302, an acceleration electrode 303, condenser lens 304 and 306, an aperture diaphragm 305, a scanning deflector 307, an objective lens 308, and an objective lens upper magnetic electrode 313. The sample chamber 327 includes a stage 309. The objective lens upper magnetic electrode 313 includes a variable voltage booster voltage power source 312, and the stage 309 includes a variable voltage retarding voltage power source 311.

The electron detection system includes E×B detectors 331 and 332, a secondary electron conversing electrode 333, and a secondary electron detector 334. The secondary electron conversing electrode 333 is connected with a voltage power source 337. The detected signals are transmitted to the transmitted signals processer 324 for measurement of dimensions. The images taken in are displayed on the monitor 325. The operation commands and operation conditions for various parts of the apparatus are inputted and outputted in and from the control unit 326.

Figure 8:
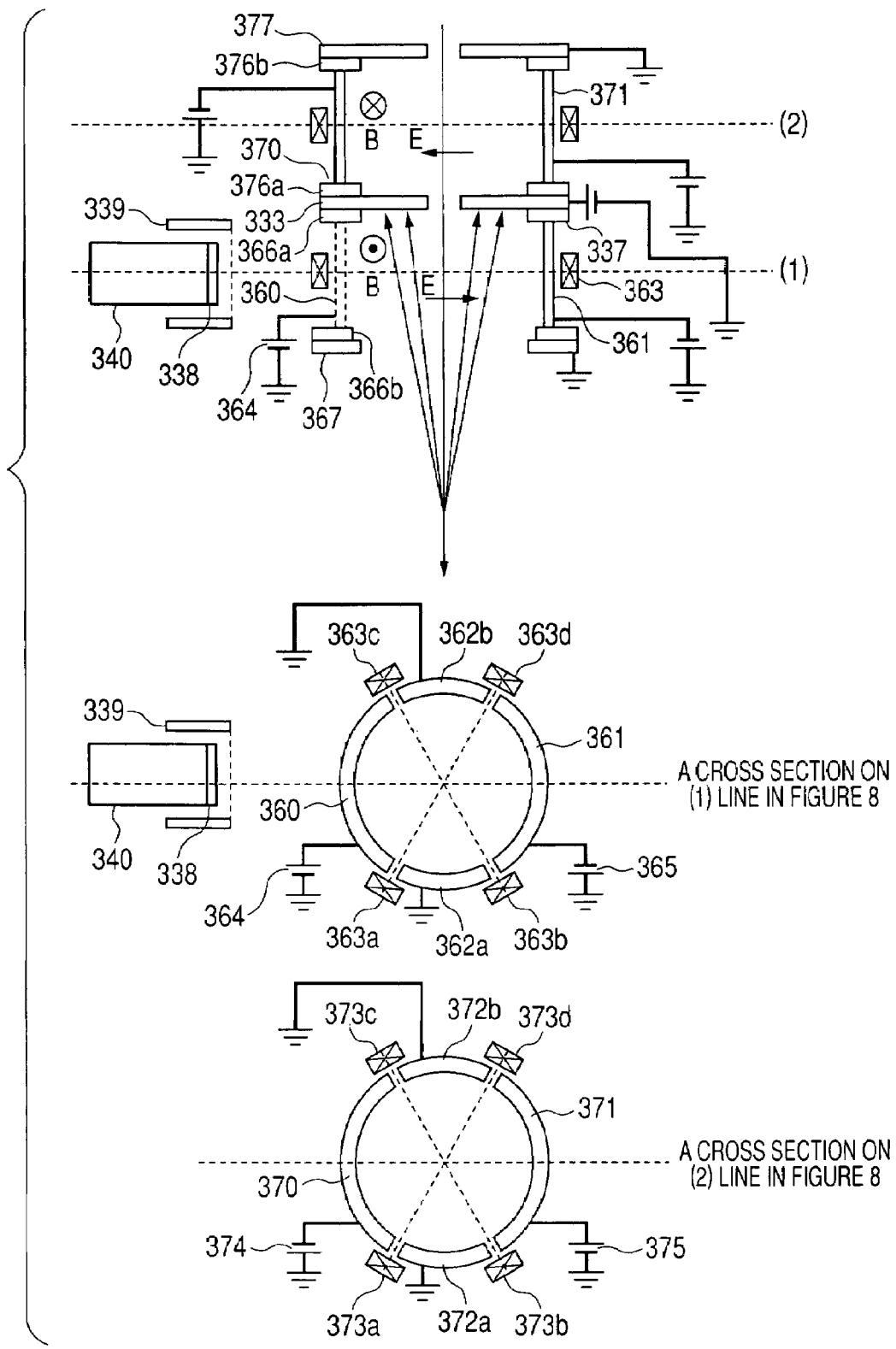
FIG. 8 illustrates an example of carrying out in a deflector for mounting on the dimension measurement SEM in the fourth embodiment of the present invention.

As FIG. 8 shows, the E×B deflector 331 includes four electrodes 360, 361, 362a and 362b for creating a deflection electric field, four coils 363a, 363b, 363c and 363d for creating a deflection magnetic field, a ground electrode 367 and insulators 366a and 366b. The electrode 360 is connected with a voltage power source 364 so that a positive voltage may be applied thereto, and the electrode 361 is connected with a voltage power source 365 so that a negative voltage may be applied thereto. The electrode 361 may sometimes be grounded. The electrodes 362a and 362b are grounded. The E×B deflector 332 includes four electrodes 370, 371, 372a and 372b for creating deflection electric field, four coils 373a, 373b, 373c and 373d for creating deflection magnetic field, a ground electrode 377 and insulators 376a and 376b. The electrode 370 is connected with a voltage power source 374 so that a negative voltage may be applied thereto, and the electrode 371 is connected with a voltage power source 375 so that a positive voltage may be applied thereto. The electrode 371 may sometimes be grounded. The electrodes 372a and 372b are grounded. The secondary electron conversing electrode 333 is connected with the voltage power source 337, and it is connected with the E×B deflector 331 through an insulator 336a, and with the E×B deflector 332 through an insulator 376a. The two E×B deflectors 331 and 332 are connected on the same axis with the opening for allowing the passage of the primary electron beam as its central axis. The secondary electron detector 334 includes a fluorescent body 338, a secondary electron suction high-voltage electrode 339, and a detector 340.

The electron gun 301 includes an extraction electrode 302, and the primary electron beam is extracted from the electron gun by applying voltage on the extraction electrode 302. For the electron source of the electron gun 301, a diffusion supply-type thermal field emission electron source Zr/O/W is used. A negative voltage −V0 is applied on the acceleration electrode 303, and the primary electron beam passes through the acceleration electrode 303 with an energy V0. In this embodiment, we chose 3 kV for V0. Then, it is converged by the condenser lens 304 to create a crossover point 314. The condenser lens 304 is connected with the condenser lens power source 320, and the control unit 326 controls its operation. And its current is restricted while it passes through the aperture diaphragm 305. And the primary electron beam is converged in the condenser lens 306, to create a crossover point 315. The condenser lens 306 is connected with the condenser lens power source 321, and the control unit 326 controls its operation. The condenser lens 304 and the condenser lens 306 are controlled in such a way that the crossover point 315 may be situated between the E×B deflector 331 and the scanning deflector 307. The primary electron beam is narrowed down sharply by an objective lens having an objective lens power source 323 controlled by the control unit 326. The stage 309 includes a variable voltage retarding voltage power source 311 so that the high-voltage potential for decelerating the primary electron beam −Vr (retarding potential) may be variable. Due to the retarding potential, the primary electron beam, being abruptly decelerated directly above the sample, is converged by the objective lens on the sample. And the deflection coil 307 disposed in two stages between the condenser lens and the objective lens causes the primary electron beam to scan the substrate to be inspected 310. The scanning deflector 307 is connected with the scanning signal generator 322, and the control unit 326 controls its operation.

At the time of irradiation of samples, the energy of the primary electron beam is (V0−Vr). Like the first embodiment, by the irradiation of the primary electron beam, the sample 310 generates secondary electrons having an energy of approximately zero to 50 eV and reflected electrons having an energy higher than 50 eV.

The objective lens upper magnetic electrode 313 includes a variable voltage booster voltage power source 312 so that a positive potential for pulling up the secondary electrons (booster potential Vb) may be applied thereto, and the secondary electrons are pulled up to the electron source side by the booster potential. Since we chose 2.2 kV for Vr in this embodiment, the primary electron beam penetrates the sample with an energy of 800 eV. We chose 6 kV for Vb. The secondary electrons advance to the electron source side being wound up to the electron source side by the pull-up electric field created by the booster electrode and the magnetic field created by the objective lens. Due to the absence of stereoimage detector for detecting reflected electrons, and a high value of Vb in comparison with the first embodiment, there are a large number of secondary electrons pulled up to the electron source side.

Between the condenser lens 306 and the objective lens, a secondary electron conversing electrode 333, being a discoidal electrode having a central hole for allowing the passage of the primary electron beam, is provided. The secondary electron conversing electrode 333 includes a means for applying voltage, and phosphor bronze is used for the material because of ease of acquisition and processing. Other materials may be used. The surface is coated with gold mainly for the purpose of preventing polluting materials from sticking thereon due to the irradiation of the secondary electron beam. Other materials may be used for the coasting material. The secondary electron conversing electrode 333 is connected with the deflector 331 for deflecting secondary electrons on the sample side through an insulator, and with a deflector 332 for canceling the aberration of the primary electron beam on the electron source side through an insulator. The embodiment of various deflectors is the same as the first embodiment.

The secondary electrons collide with the secondary electron conversing electrode 333, from which the secondary electrons are generated. By the deflection field of the deflector 331, the secondary electrons are deflected in the direction of the detector, infiltrate a mesh electrode 360 and enter the detector 340 being accelerated by the suction electrode 339.

Also in this embodiment, like the cause of generation of shading described in the first embodiment, if the secondary electron conversing electrode has no means of applying voltage, the efficiency of detecting the secondary electrons varies depending on the position where the secondary electrons collide with the secondary electron conversing electrode 333, and the efficiency of detecting the secondary electrons becomes uneven in the surface of the secondary electron conversing electrode. When we observe samples at a low magnification, the secondary electrons are largely deflected by the scanning deflector, and if there is any area where the efficiency of detection has fallen down in the scope of scanning while we are scanning the secondary electron conversing electrode 333, the efficiency of detecting the secondary electrons varies depending on the position of scanning. This constitutes a cause for the appearance of shading on the acquired images.

The presence of shadings on the acquired image constitutes a cause that cannot be measured correctly in the dimension measurement SEM for evaluating the dimension of semiconductor patterns from the acquired image. Therefore, a voltage is applied on the secondary electron conversing electrode 333 by the controlling means of voltage 337, and the voltage is controlled at a level higher than the electrodes 362*a* and 362*b* to adjust the equipotential distribution. Thus, the force is created for pulling up the secondary electrons towards the conversion electrode. In this way, the secondary electrons that collided with the cover beneath the detector or the electrode 361 and were not absorbed by the detector advance between the secondary electron conversing electrode 333 and the grounded electrode 367.

Incidentally, the embodiment of the deflector is similar to the first embodiment, and its structure is shown in FIG. 8. Since the structure is the same, the deflection action on the primary electron beam and the deflection action on the secondary electron are similar to the first embodiment, and in addition as the two deflectors having reverse deflection polarity are joined respectively through the secondary electron conversing electrode and an insulator, the correction of deflection aberration by the deflectors vis-à-vis the primary electron beam can obviously be obtained in the same way as the first embodiment.

What is claimed is:

1. A charged electron beam apparatus irradiating a sample with primary charged particle beam, and detecting secondary charged particles secondarily generated comprising:
    a stage to hold the sample;
    a charged particle source for generating the primary charged particle beam;
    a condenser lens for converging said primary charged particle beam;

an objective lens for irradiating said sample with said converged primary charged particle beam; and a secondary electron conversing unit arranged between said condenser lens and said objective lens, said secondary electron conversing unit comprising:

a secondary electron conversing electrode to which said secondary charged particles are collided;

a first ExB deflector for deflecting the secondary electrons generated at said secondary electron conversing electrode;

a second ExB deflector for reducing chromatic aberration generated in said primary charged particle beam by said first ExB deflector; and a detector for detecting said deflected secondary electrons.

2. The charged particle beam apparatus according to claim 1, wherein said first ExB deflector and said second ExB deflector are disposed at mutually two-rotation symmetrical positions with respect to said primary charged particle beam.

3. The charged particle beam apparatus according to claim 1, further comprising a voltage source connected with said secondary electron conversing electrode, wherein said voltage power source maintains a potential of said secondary electron conversing electrode higher than ground potential of said first ExB deflector.

4. The charged particle beam apparatus according to claim 1, further comprising a retarding voltage source connected with the stage.

5. The charged particle beam apparatus according to claim 1, further comprising:

an insulator disposed between said first ExB deflector and said secondary electron conversing electrode, and between said secondary electron conversing electrode and said second ExB deflector.

6. The charged particle beam apparatus according to claim 1, wherein said first ExB deflector is disposed at sample directing side of the secondary electron conversing electrode through an insulator therein, and said second ExB deflector is disposed at charged electron particle source directing side of the secondary electron conversing electrode through an insulator therein.

7. The charged particle beam apparatus according to claim 1, wherein said secondary electron conversion unit is disposed near the crossover point of said primary charged particle beam that passes said condenser lens.

8. The charged particle beam apparatus according to claim 6, further comprising a voltage source connected with said secondary electron conversing electrode;

wherein said voltage power source maintains a potential of said secondary electron conversing electrode higher than ground potential of said first ExB deflector.

9. A scanning electron microscope including an electron optical column having the functions of scanning a primary electron beam on the sample stored in the sample chamber, detecting secondary charged particles generated by irradiation of the primary electron beam, and outputting the secondary charged particle signal, said electron optical column comprising:

an electron source;

an electron lens;

a scanning deflector;

first and second ExB deflectors disposed in such a way that polarity inverts mutually between the electron source and the scanning deflector;

a secondary electron conversing electrode; and a controlling power source for driving the electron lens to form said crossover point of the primary electron beam between said scanning deflector and the ExB deflector disposed at lower position of said first and second ExB deflectors.

10. The scanning electron microscope according to claim 9, wherein said first ExB deflector and said second ExB deflector are disposed at mutually two-rotation symmetrical positions with respect to said primary charged particle beam.

11. The scanning electron microscope according to claim 9, further comprising a voltage source connected with the secondary electron conversing electrode, wherein said voltage power source maintains the potential of said secondary electron conversing electrode higher than that of a ground potential of said first ExB deflector.

12. The scanning electron microscope according to claim 9, further comprising:

an insulator disposed between said first ExB deflector and said secondary electron conversing electrode, and between said secondary electron conversing electrode and said second ExB deflector.

13. The scanning electron microscope according to claim 9, wherein said first ExB deflector is disposed on sample directing side of the secondary electron conversing electrode through an insulator therein, and said second ExB deflector is disposed on charged electron particle source directing side of the secondary electron conversing electrode through an insulator therein.

14. The scanning electron microscope according to claim 12, further comprising a voltage source connected with said secondary electron conversing electrode;

wherein said voltage power source maintains a potential of said secondary electron conversing electrode higher than ground potential of said first ExB deflector.

15. The scanning electron microscope according to claim 13, wherein said electron lens includes a condenser lens for converging the primary electron beam from said electron source, and said controlling power source includes a condenser lens power source, and wherein said controlling power source controls formation of said crossover point between said first ExB deflector and said scanning deflector.

16. A sample observation method of observing a sample by scanning a desired area of the sample with primary charged particle beam, comprising the steps of:

irradiating the desired area with said primary charged particle beam;

colliding the secondary charged particles generated secondarily by the irradiation of the primary charged particle beam to the secondary electron conversing electrode;

directing secondary electrons generated from the secondary electron conversing electrode by the collision to the detector, with using first ExB deflector placed at sample directing side of the secondary electron conversing electrode through an insulator; and reducing the deflection chromatic aberration occurring in said primary charged particle beam at the first E×B deflector, with using second E×B deflector disposed to the first E×B deflector through an insulator.

17. The sample observation method according to claim 16, wherein said first E×B deflector and said second E×B deflector are disposed at two-rotation symmetrical positions with respect to said primary charged particle beam.

18. The sample observation method according to claim 16, wherein a voltage is applied to said secondary electron conversing electrode.

19. The sample observation method according to claim 16, wherein the potential of said secondary electron conversing electrode is higher than that of the ground potential of said first E×B deflector.

* * * * *